US010096606B1

(12) United States Patent
Zang

(10) Patent No.: US 10,096,606 B1
(45) Date of Patent: Oct. 9, 2018

(54) METHODS OF FORMING A GATE STRUCTURE-TO-SOURCE/DRAIN CONDUCTIVE CONTACT ON VERTICAL TRANSISTOR DEVICES AND THE RESULTING TRANSISTOR DEVICES

(71) Applicant: GLOBALFOUNDRIES Inc., Grand Cayman (KY)

(72) Inventor: Hui Zang, Guilderland, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/813,471

(22) Filed: Nov. 15, 2017

(51) Int. Cl.
*H01L 27/11* (2006.01)
*H01L 21/8238* (2006.01)
(Continued)

(52) U.S. Cl.
CPC .... *H01L 27/1104* (2013.01); *H01L 21/02164* (2013.01); *H01L 21/31111* (2013.01); *H01L 21/32133* (2013.01); *H01L 21/823828* (2013.01); *H01L 21/823857* (2013.01); *H01L 21/823871* (2013.01); *H01L 21/823885* (2013.01); *H01L 27/092* (2013.01); *H01L 29/0649* (2013.01); *H01L 29/0847* (2013.01); *H01L 29/1037* (2013.01);
(Continued)

(58) Field of Classification Search
CPC ............. H01L 27/1104; H01L 29/6653; H01L 21/823871; H01L 29/0649; H01L 29/1037; H01L 27/092; H01L 29/7827; H01L 21/823857; H01L 21/02164; H01L 21/823885; H01L 29/45; H01L 29/0847; H01L 21/32133
See application file for complete search history.

(56) References Cited

U.S. PATENT DOCUMENTS 8,754,481 B2  6/2014  Masuoka et al.
2004/0061153 A1*  4/2004  Misewich ............... G11C 11/22
257/295
(Continued)

OTHER PUBLICATIONS

Chung et al., "Novel 4F2 DRAM Cell with Vertical Pillar Transistor (VPT)," 2011 IEEE, pp. 211-214.
(Continued)

*Primary Examiner* — John P Dulka
(74) *Attorney, Agent, or Firm* — Amerson Law Firm, PLLC

(57) ABSTRACT

In one example, the method includes removing a portion of at least a layer of a bottom spacer material positioned above a first bottom source/drain (S/D) region of a first vertical transistor so as to thereby form a gate-to-source/drain contact opening that exposes a portion of the first bottom S/D region, forming a continuous conductive gate electrode material layer above the first bottom S/D region and a second bottom S/D region and within the gate-to-source/drain contact opening, and removing a portion of the continuous gate electrode material layer so as to form first and second separate gate structures for the first and second vertical transistors, respectively, wherein a portion of the second gate structure is positioned within the gate-to-source/drain contact opening, thereby conductively coupling the second gate structure to the first bottom S/D region.

18 Claims, 10 Drawing Sheets

(51) Int. Cl.
  H01L 21/311    (2006.01)
  H01L 21/3213   (2006.01)
  H01L 29/08     (2006.01)
  H01L 29/45     (2006.01)
  H01L 29/66     (2006.01)
  H01L 21/02     (2006.01)
  H01L 29/78     (2006.01)
  H01L 27/092    (2006.01)
  H01L 29/10     (2006.01)
  H01L 29/06     (2006.01)
  H01L 21/027    (2006.01)

(52) U.S. Cl.
  CPC .......... *H01L 29/45* (2013.01); *H01L 29/6653* (2013.01); *H01L 29/7827* (2013.01); *H01L 21/0228* (2013.01); *H01L 21/0273* (2013.01); *H01L 21/31144* (2013.01)

(56) References Cited

U.S. PATENT DOCUMENTS

| | | |
|---|---|---|
| 2004/0113207 A1 | 6/2004 | Hsu et al. |
| 2006/0017119 A1* | 1/2006 | Jin ................ H01L 21/845 257/401 |
| 2007/0075359 A1* | 4/2007 | Yoon ............. H01L 27/10876 257/329 |
| 2008/0179693 A1 | 7/2008 | Kim et al. |
| 2008/0203493 A1* | 8/2008 | Yasuda ........... H01L 21/76816 257/377 |
| 2010/0203714 A1 | 8/2010 | Masuoka et al. |
| 2014/0003133 A1 | 1/2014 | Lin et al. |
| 2015/0318288 A1 | 11/2015 | Lim et al. |
| 2016/0133633 A1 | 5/2016 | Liaw |
| 2017/0287905 A1* | 10/2017 | Morrow ........... H01L 27/0688 |

OTHER PUBLICATIONS

Huynh-Bao et al_, "Toward the 5nm Technology: Layout Optimization and Performance Benchmark for Logic/SRAMs Using Lateral and Vertical GAA FETs".

Huynh-Bal et al., "A Comprehensive Benchmark and Optimization of 5-nm Lateral and Vertical GAA 6T-SRAMs," IEEE Transactions on Electron Devices, 63:643-51, Feb. 2016.

Sharma et al., "SRAM Design for Wireless Sensor Networks, Chapter 2 SRAM Bit Cell Optimization," Springer, 2013.

* cited by examiner

METHODS OF FORMING A GATE STRUCTURE-TO-SOURCE/DRAIN CONDUCTIVE CONTACT ON VERTICAL TRANSISTOR DEVICES AND THE RESULTING TRANSISTOR DEVICES

BACKGROUND OF THE INVENTION

1. Field of the Invention

The present disclosure generally relates to the fabrication of semiconductor devices, and, more particularly, to various novel methods of forming a gate structure-to-source/drain conductive contact structure on vertical transistor devices and the resulting novel device structures.

2. Description of the Related Art

Semiconductor memory devices are in widespread use in many modern integrated circuit (IC) products. In general, memory devices are the means by which electrical information is stored. There are many types of memory devices, SRAMs (Static Random Access Memory), DRAMs (Dynamic Random Access Memory), ROMs (Read Only Memory), etc., each of which has its own advantages and disadvantages relative to other types of memory devices. For example, SRAMs are typically employed in applications where higher speed and/or reduced power consumption is important, e.g., cache memory of a microprocessor, mobile phones and other mobile consumer products, etc. Millions of such memory devices are typically included in even very basic electronic consumer products. Irrespective of the type of memory device, there is a constant drive in the industry to increase the performance and durability of such memory devices. In typical operations, an electrical charge (HIGH) is stored in the memory device to represent a digital "1", while the absence of such an electrical charge or a relatively low charge (LOW) stored in the device indicates a digital "0". Read/write circuitry is used to access the memory device to store digital information on such a memory device and to determine whether or not a charge is presently stored in the memory device. These read/write cycles typically occur millions of times for a single memory device over its effective lifetime.

FIG. 1 depicts a typical prior art 6T (six transistor) SRAM memory cell 10 that includes two NMOS pass gate transistors PG1, PG2, two PMOS pull-up transistors PU1, PU2, and two NMOS pull-down transistors PD1, PD2. Each of the PMOS pull-up transistors PU1, PU2 has its gate (14A, 14B, respectively) connected to the gate (16A, 16B, respectively) of a corresponding NMOS pull-down transistor PD1, PD2. The PMOS pull-up transistors PU1, PU2 have their drain regions (D) connected to the drain regions of corresponding NMOS pull-down transistors PD1, PD2 to form inverters having a conventional configuration. The source regions (S) of the PMOS pull-up transistors PU1, PU2 are connected to a high reference potential, typically VDD. The source regions (S) of the NMOS pull-down transistors PD1, PD2 are connected to a lower reference potential, typically VSS or ground. The PMOS pull-up transistor PUI and the NMOS pull-down transistor PD1 make up one inverter of the SRAM cell 10. The PMOS pull-up transistor PU2 and the NMOS pull-down transistor PD2 make up the other inverter of the SRAM cell 10.

The gate 14A of the PMOS pull-up transistor PUI and the gate 16A of the NMOS pull-down transistor PD1 are cross-coupled (i.e., connected) to the drain regions (D) of the transistors PU2, PD2 of the other inverter at node N2. Similarly, the gate 14B of the PMOS pull-up transistor PU2 and the gate 16B of the NMOS pull-down transistor PD2 are cross-coupled (i.e., connected) to the drain regions (D) of the transistors PU1, PD1 at node N1. Hence, the potential present on the drain regions of the transistors PU1, PD1 (node N1) of the first inverter is applied to the gates of transistors PU2, PD2 of the second inverter and the charge serves to keep the second inverter in an ON or OFF state. The logically opposite potential is present on the drain regions of the transistors PU2, PD2 (node N2) of the second inverter and on the gates of the transistors PU1, PD1 of the first inverter, keeping the first inverter in the complementary OFF or ON state relative to the second inverter. Thus, the latch of the illustrated SRAM cell 10 has two stable states: a first state with a predefined potential present on charge storage node N1 and a low potential on charge storage node N2; and a second state with a low potential on charge storage node N1 and the predefined potential on charge storage node N2. Binary data are recorded by toggling between the two states of the latch. Sufficient charge must be stored on the charge storage node, and thus on the coupled gates of the associated inverter, to unambiguously hold one of the inverters "ON" and unambiguously hold the other of the inverters "OFF", thereby preserving the memory state. The stability of an SRAM cell 10 can be quantified by the margin by which the potential on the charge storage nodes can vary from its nominal value while still keeping the SRAM 10 cell in its original state.

In manufacturing such an SRAM cell 10, a conductive contact structure must be formed to cross-couple (or connect) a shared source/drain region on the first inverter with a gate structure of the second inverter. Such cross-coupled contact structures may also be formed on other IC devices and in different applications than the above-described SRAM cell 10. The present disclosure is directed to various novel methods of forming a gate structure-to-source/drain conductive contact structure on vertical transistor devices and the resulting novel device structures for various types of IC products.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming a gate structure-to-source/drain conductive contact structure on vertical transistor devices and the resulting novel device structures. One illustrative method is disclosed herein for forming a gate structure-to-source/drain conductive contact structure between a first vertical transistor that comprises a first bottom source/drain (S/D) region and a second vertical transistor that comprises a second bottom source/drain (S/D) region. In one example, the method includes performing at least one first etching process to remove a portion of at least a layer of a bottom spacer material positioned above the first bottom source/drain (S/D) region so as to thereby form a gate-to-source/drain contact opening that exposes a portion of the first bottom S/D region, forming a continuous conductive gate electrode material layer above the first and second bottom S/D regions and within the gate-to-source/drain contact opening and performing at least one second etching process to remove a portion of the continuous gate electrode material layer so as to form first and second separate gate structures for the first and second vertical transistors, respectively, wherein a portion of the second gate structure is positioned within the gate-to-source/drain contact opening, thereby conductively coupling the second gate structure to the first bottom S/D region.

One illustrative integrated circuit product disclosed herein comprises a first vertical transistor that includes a first vertically oriented channel semiconductor (VOCS) structure, a first bottom source/drain (S/D) region, a first bottom spacer positioned above the first bottom S/D region, wherein the the first bottom spacer comprises a gate-to-source/drain contact opening, and a first gate electrode structure positioned above the first bottom spacer and around the first VOCS structure. In this example, the product also comprises a second vertical transistor that includes a second vertically oriented channel semiconductor (VOCS) structure, a second bottom source/drain (S/D) region, a second bottom spacer positioned above the second bottom S/D region and a second gate electrode structure positioned above the second bottom spacer and around the second VOCS structure, wherein a portion of the second gate structure is positioned within the gate-to-source/drain contact opening, thereby conductively coupling the second gate structure to the first bottom S/D region.

BRIEF DESCRIPTION OF THE DRAWINGS

The disclosure may be understood by reference to the following description taken in conjunction with the accompanying drawings, in which like reference numerals identify like elements, and in which.

Figure 1:
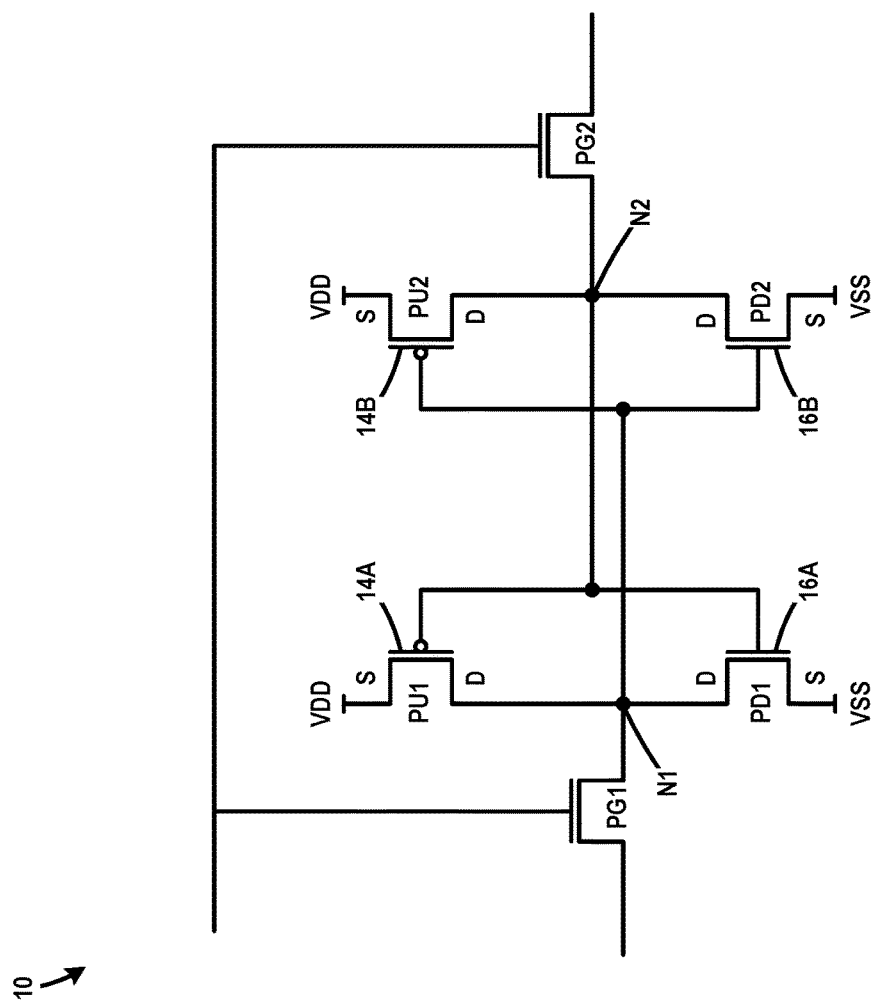
FIG. 1 is an electrical schematic of an illustrative prior art SRAM device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various novel methods of forming a gate structure-to-source/drain conductive contact structure (which may also be referred to herein as a cross-coupled contact) on IC products comprising vertical transistor devices and the resulting novel device structures. As will be appreciated by those skilled in the art after a complete reading of the present application, the methods disclosed herein may be employed to form a gate structure-to-source/drain conductive contact structure in a variety of different applications. For example, the methods disclosed herein may be employed to form a gate structure-to-source/drain conductive contact structure on an SRAM device, like the one described in the background section of this application. Other applications where such cross-coupled contact structures may be employed include, but are not limited to, various devices that are typically found in the logic portion of an IC product, etc. Thus, the inventions disclosed and claimed herein should not be considered to be limited to any particular application where such cross-coupled contacts may be formed. With reference to the attached figures, various illustrative embodiments of the methods and devices disclosed herein will now be described in more detail.

Figure 2:
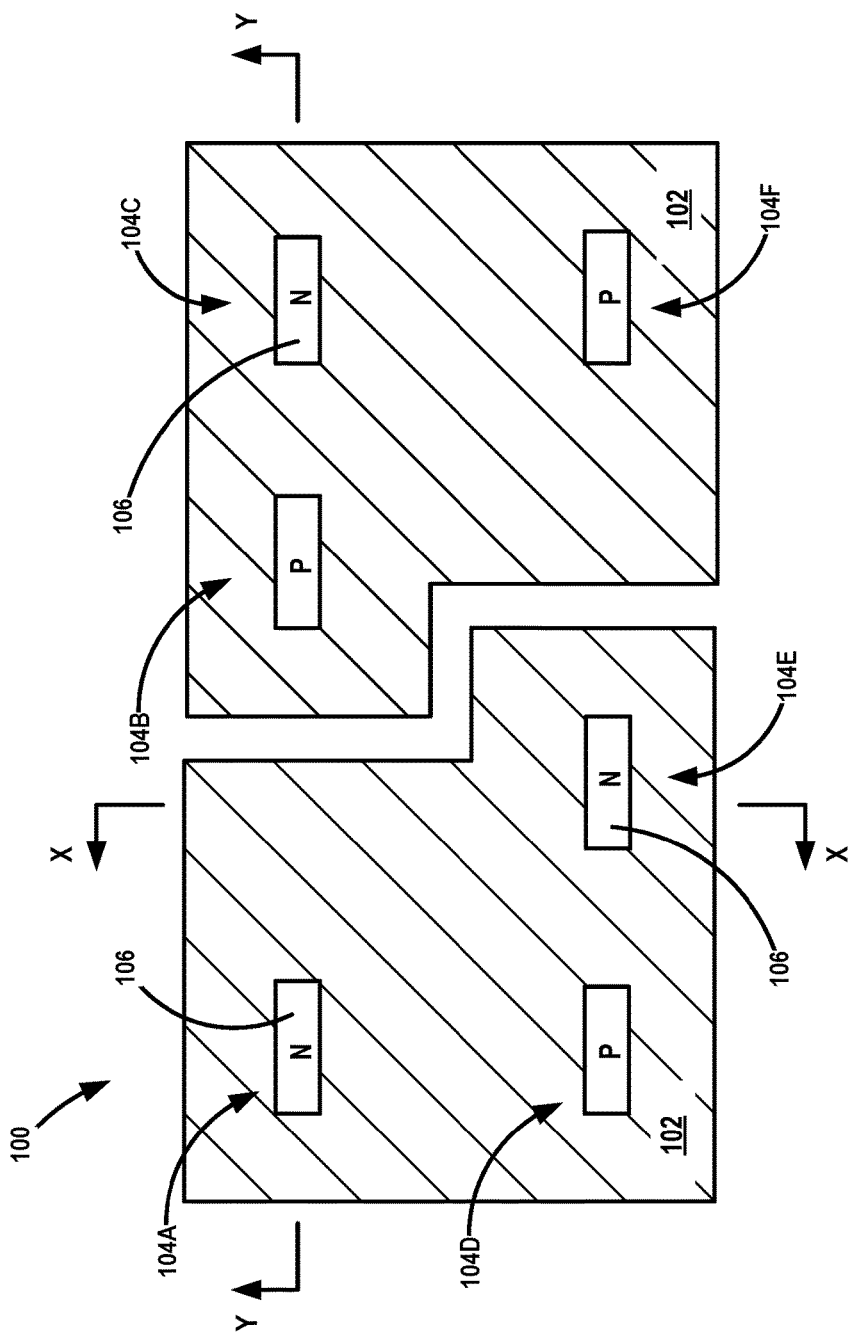
FIGS. 2-10 are cross-sectional views that depict various novel methods of forming a gate structure-to-source/drain conductive contact structure on vertical transistor devices and the resulting novel device structures.

FIGS. 2-10 are various views that depict the multiple novel methods disclosed herein for forming a gate structure-to-source/drain conductive contact structure on an IC product 100 that comprises vertical transistor devices, and the resulting novel device structures. FIG. 2 is a simplistic plan view of the IC product 100 that includes six illustrative and schematically depicted vertical transistor devices 104A-104F (generally referenced using the numeral 104) that are formed above an illustrative semiconductor substrate 102. Each of the transistors 104 includes a simplistically depicted vertically oriented channel semiconductor (VOCS) structure 106. Those skilled in the art will appreciate that, in this example, the depicted IC product 100 includes an illustrative six-transistor SRAM cell. In the example, the transistors 140A, C and E are N-type devices, while the transistors 104B, D and F are P-type devices. FIG. 2 also depicts where various cross-sectional views are taken in the drawings. More specifically, the view X-X is a cross-sectional view taken through the transistor 104E, while the view Y-Y is a cross-sectional view taken through the transistors 104A, 104B and 104C. The substrate 102 may have a variety of configurations, such as the bulk substrate configuration depicted herein or a semiconductor-on-insulator (SOI) configuration. Such an SOI substrate includes a bulk semiconductor layer, a buried insulation layer positioned on the bulk semiconductor layer and an active semiconductor layer positioned on the buried insulation layer, wherein the transistor devices 104 are formed in and above the active layer. The active layer and/or the bulk semiconductor layer may be made of silicon or they may be made of semiconductor materials other than silicon, and they both do not have to be made of the same semiconductor material. Thus, the terms "substrate" or "semiconductor substrate" should be understood to cover all semiconducting materials and all forms of such materials.

Figure 3:
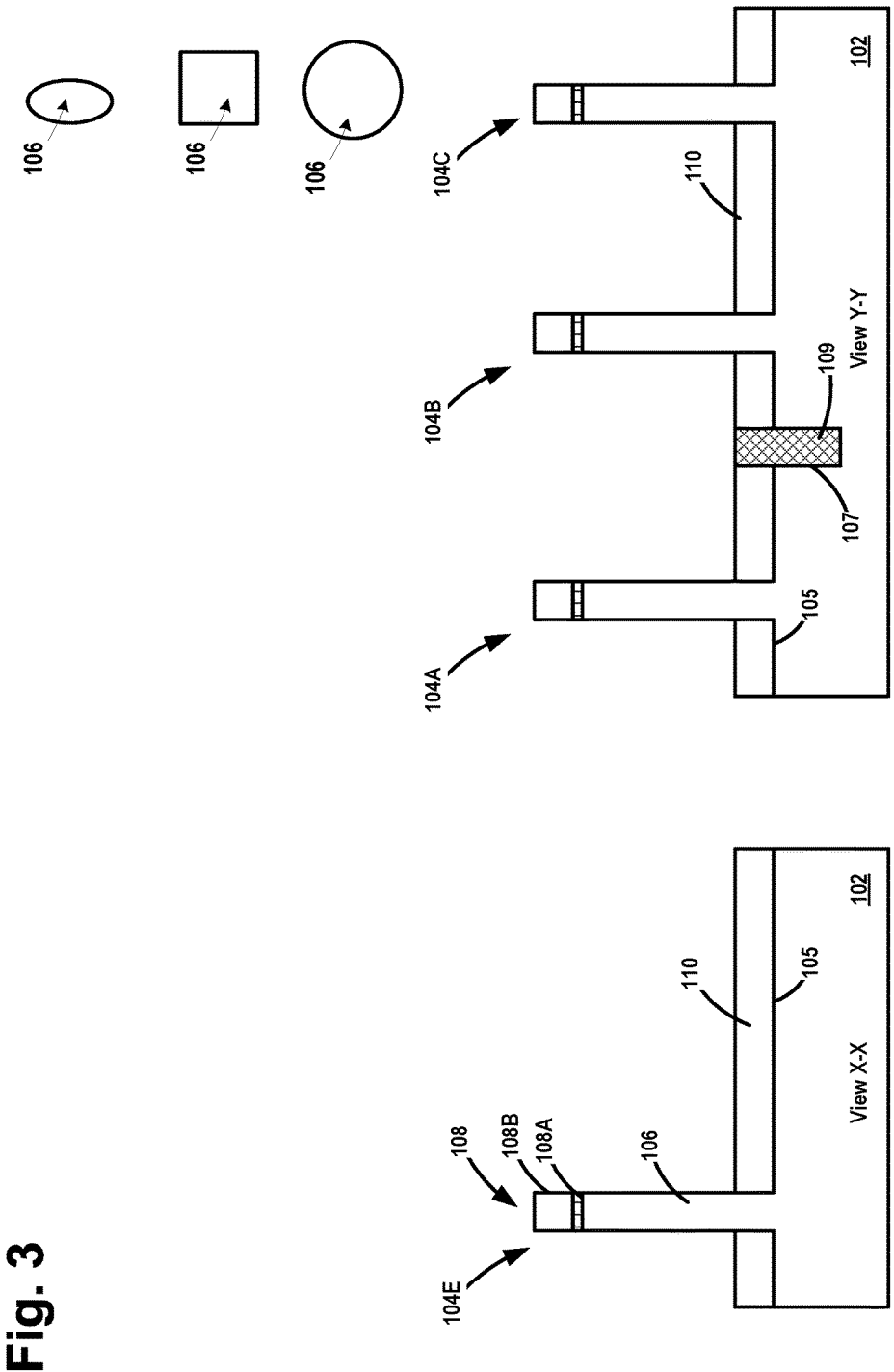

FIG. 3 depicts the IC product 100 after several process operations were performed. First, the VOCS structures 106 for the transistors 104 were formed by performing one or more etching processes through a patterned etch mask 108 so as to define a plurality of trenches 105 in the substrate 102. In the illustrated examples, the VOCS structures 106 have a rectangular cross-section when viewed from above. In other embodiments, the VOCS structures 106 may have different cross-section shapes, such as circle, oval, square, etc., as shown in the upper right-hand portion of FIG. 3. In some embodiments, the patterned etch mask 108 may be comprised of one or more layers of material, and it may be formed by forming one or more layers of material and thereafter patterning those materials using known photolithography and etching techniques. In one illustrative embodiment, the patterned etch mask 108 may be a dual-layer etch mask that is comprised of a layer of silicon dioxide 108A and a layer of silicon nitride 108B. Next, in one illustrative embodiment, an epitaxial deposition process was performed to form an un-doped layer of epi semiconductor material 110 in the trenches 105 around the VOCS structures 106. The un-doped layer of epi semiconductor material 110 may be formed to any desired thickness. As will be appreciated by those skilled in the art, the formation of the un-doped layer of epi semiconductor material 110 is part of the process of forming bottom source/drain regions for the transistor devices 104. Of course, other techniques may be employed to form the bottom source/drain regions for the transistors if desired. Various protective spacers formed on the sidewalls of the VOCS structures 106 during the epi deposition process are not depicted. Then, an etching process was performed through another patterned etch mask (not shown, such as a patterned layer of photoresist) to define an isolation trench 107 that extends through the un-doped layer of epi semiconductor material 110 and into the substrate 102. A layer of insulating material 109, such as silicon dioxide, was then deposited so as to over-fill the remaining space above the trenches 105 and to fill the trench 107 such that insulating material 109 was positioned above the upper surface of the patterned etch mask 108. Thereafter, a CMP process was performed to planarize the upper surface of the deposited layer of insulating material 109 with the upper surface of the patterned etch mask 108. At that point, a recess etching process was performed to recess the layer of insulating material 109 such that an upper surface of the insulating material 109 was approximately level with the upper surface of the un-doped layer of epi semiconductor material 110 so as to define an isolation structure comprised of the insulating material 109.

Figure 4:
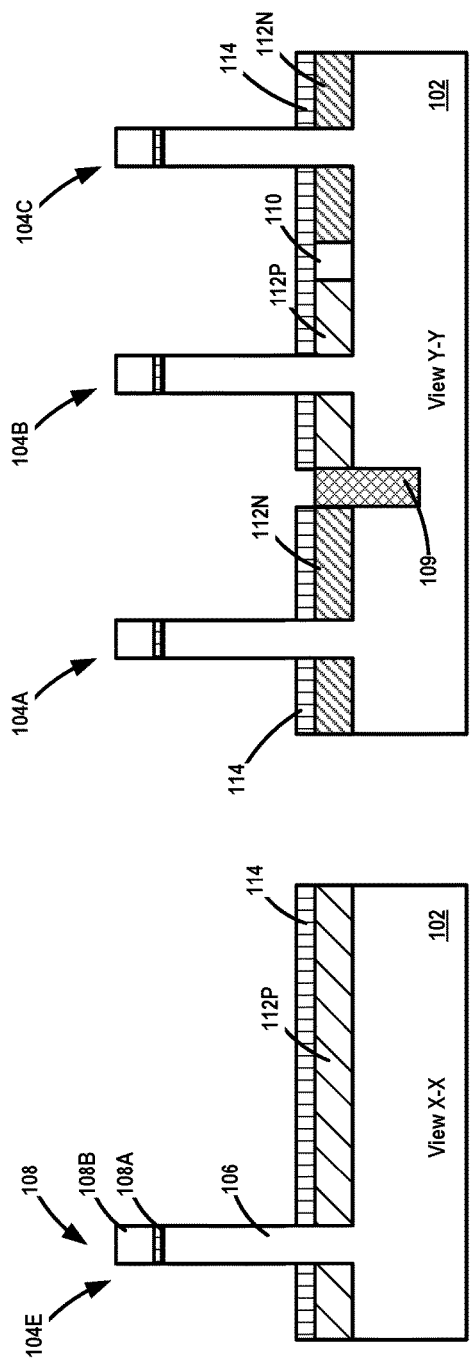

FIG. 4 depicts the product 100 after several process operations were performed. First, N-doped bottom source/drain regions 112N were formed for the N-type transistors 104A and 104C and P-doped bottom source/drain regions 112P were formed for the P-type transistors 104B and 104E. The doped source/drain regions 112N, 112P were formed by performing separate ion implantation processes through two separate patterned ion implantation masks (not shown, e.g., patterned photoresist masks). The doped source/drain regions 112N, 112P may be formed in any desired order. Note that a portion of the un-doped layer of epi semiconductor material 110 (a portion between the transistors 104B and 104C in view Y-Y) was masked and therefore not doped during these ion implantation processes. As depicted, the isolation structure 109 is positioned in a semiconductor substrate 102 and laterally between the bottom source/drain region 112N of the transistor 104A and the bottom source/drain region 112P of the transistor 104B. Next, a metal silicide layer 114 was formed on the upper surfaces of the doped source/drain regions 112N, 112P as well as the remaining un-doped portion of the initial un-doped layer of epi semiconductor material 110. The metal silicide layer 114 may be formed to any desired thickness, and it may be comprised of any desired material, e.g., cobalt silicide, titanium silicide, etc. Various protective spacers that are formed on the VOCS structures 106 to prevent formation of the metal silicide material during this process are not depicted. The metal silicide material 114 may be formed by depositing a conformal layer of metal, e.g., cobalt, titanium, nickel, etc., and thereafter performing an anneal process. At that point, non-reacted portions of the deposited metal layer may then be removed by etching, followed by the removal of the protective spacers on the sides of the VOCS structures 106. Note that the metal silicide material 114 does not form on the insulating material 109 of the isolation structure. The metal silicide material 114 need not be formed in all applications. When present, the metal silicide material 114 is part of the bottom source/drain regions 112.

Figure 5:
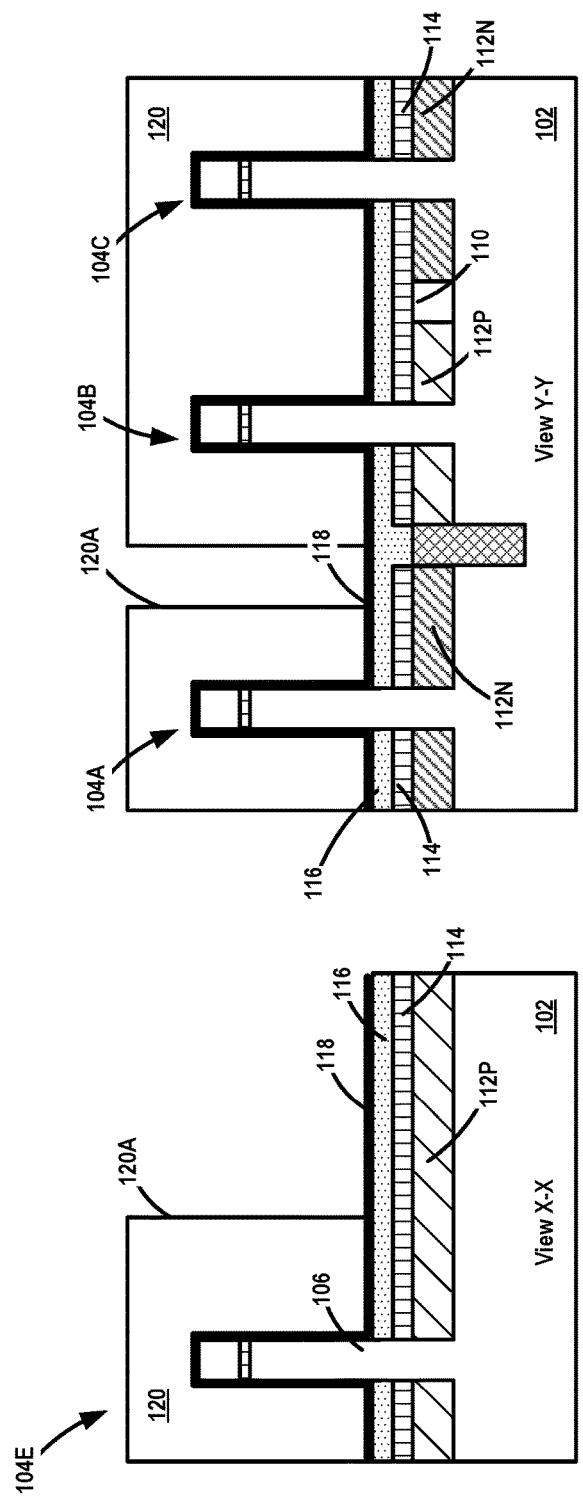

FIG. 5 depicts the product 100 after several process operations were performed.

First, a continuous layer of bottom spacer material 116 was formed above the metal silicide material 114 around all of the VOCS structures 106. The continuous layer of bottom spacer material 116 may be formed to any desired thickness, e.g., 4-15 nm, and it may be formed from any desired insulating material, e.g., a low-k insulating material (k value of 7 or less), silicon dioxide, etc. In one embodiment, the continuous layer of bottom spacer material 116 may be formed by performing a deposition process so as to over-fill the trenches 105 with insulating material. Thereafter, the upper surface of the continuous layer of bottom spacer material 116 may be planarized by performing, for example, a CMP process, that stops on the patterned etch mask 108. Then, a timed selective recess etching process was performed to recess the layer of bottom spacer material 116 to a desired residual thickness. In another embodiment, the continuous layer of bottom spacer material 116 may be formed by performing a directional deposition process, such as a gas cluster ion beam (GCIB) process or an HDP deposition process, to form the continuous layer of bottom spacer material 116 substantially on only the horizontally oriented surfaces of the product 100, i.e., on the upper surface of the metal silicide material 114 and on the upper surfaces of the patterned etch mask 108. The formation of the continuous layer of bottom spacer material 116 on the upper surface of the patterned etch mask 108 is not shown as it is not required for purposes of the presently disclosed inventions.

In the example depicted herein, the novel methods and devices will be described in the context where a gate-first manufacturing technique was performed to form the gate structures for the transistors 104. Accordingly, still referencing FIG. 5, a conformal deposition process, e.g., an atomic layer deposition (ALD) process, was performed to form a relatively thin (e.g., 2-5 nm) continuous gate insulation layer 118. The gate insulation layer 118 may be comprised of a material such as silicon dioxide or a high-k (k value greater than 10) insulating material. Then, a patterned etch mask 120, e.g., a patterned layer of photoresist, with an opening 120A formed therein, was formed above the gate insulation layer 118.

Figure 6:
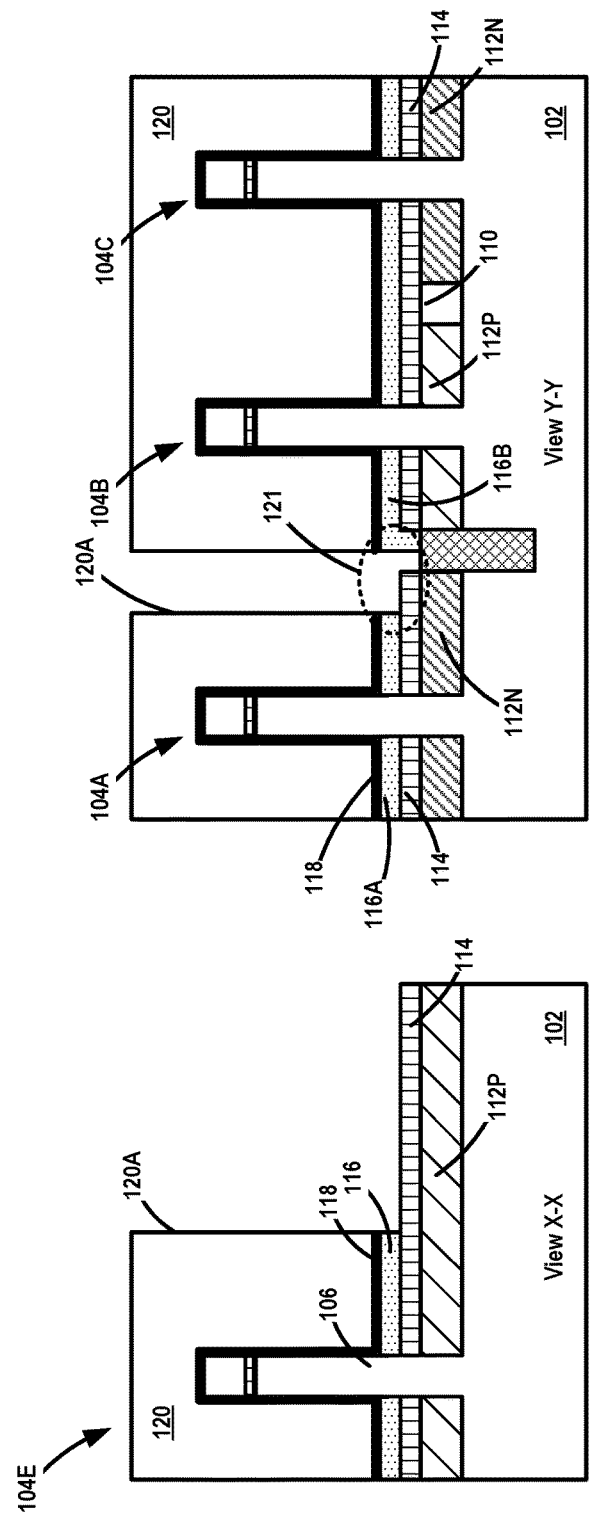

FIG. 6 depicts the product 100 after one or more etching processes were performed through the patterned etch mask 120 to remove portions of the continuous gate insulation layer 118 and the continuous layer of bottom spacer material 116 positioned below the opening 120A. The process operation forms a first bottom spacer 116A for the transistor 104A and a second bottom spacer 116B for the transistor 104B. Note that this process operation forms a gate-to-source/drain contact opening 121 in the bottom spacer material layer 116 that exposes a portion of the bottom source/drain region 112N of the transistor 104A (see view Y-Y). More specifically, in this example, a portion of the metal silicide layer 114 (that is part of the bottom source/drain region 112N) is exposed.

Figure 7:
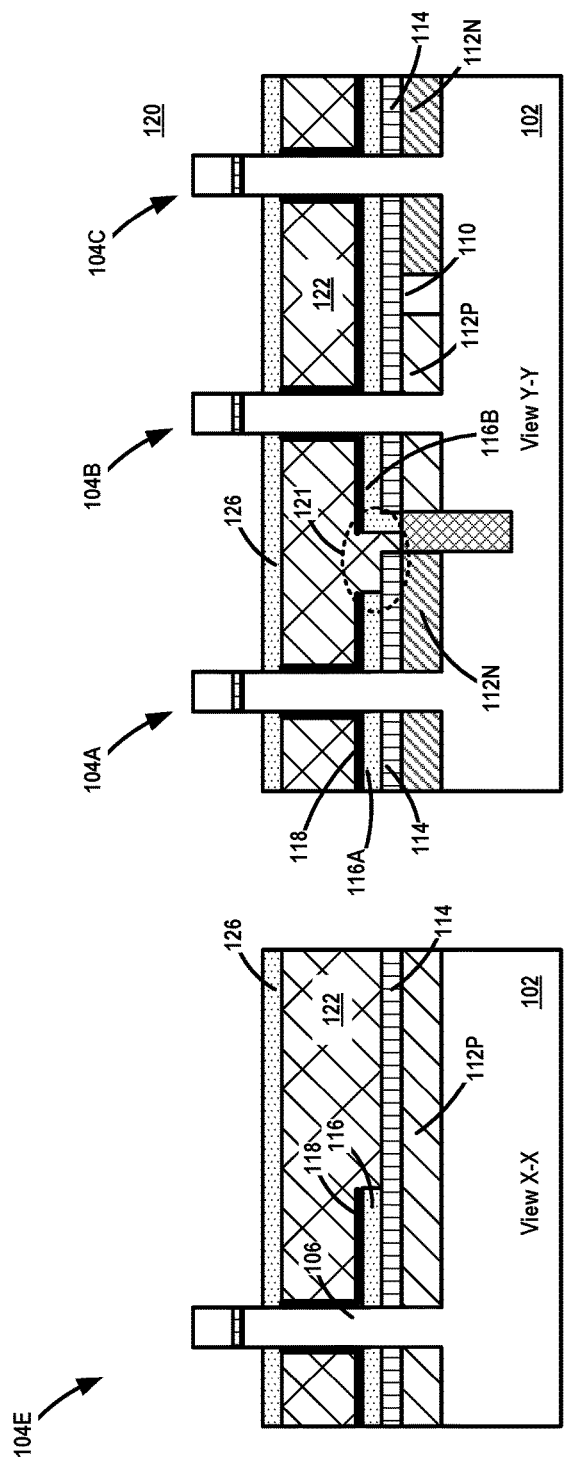

FIG. 7 depicts the product 100 after several process operations were performed. First, the patterned etch mask 120 was removed. Then, a continuous conductive gate electrode material layer 122 was deposited on the gate insulation layer 118 between and around the VOCS structures 106 for all of the transistors 104. As depicted, a portion of the continuous conductive gate electrode material layer 122 is formed within the gate-to-source/drain contact opening 121 and is conductively coupled to the bottom source/drain region 112N of the transistor 104A. The continuous conductive gate electrode material layer 122 may be comprised of a variety of different conductive materials, e.g., a metal, a metal alloy, titanium nitride, tantalum nitride, tungsten, aluminum, polysilicon, etc., and it may be formed to any desired thickness. In one embodiment, the continuous conductive gate electrode material layer 122 may be formed by performing a deposition process so as to over-fill the trenches 105 with the conductive gate electrode material layer 122. Thereafter, the upper surface of the conductive gate electrode material layer 122 may be planarized by performing, for example, a CMP process, that stops on the patterned etch mask 108. Then, a timed selective recess etching process was performed to recess the conductive gate electrode material layer 122 to a desired residual thickness. In another embodiment, the conductive gate electrode material layer 122 may be formed by performing a directional deposition process, such as a gas cluster ion beam (GCIB) process or an HDP deposition process, to form the conductive gate electrode material layer 122 substantially on only the horizontally oriented surfaces of the product 100, i.e., on the upper surface of the gate insulation layer 118 and on the upper surfaces of the patterned etch mask 108. The formation of the conductive gate electrode material layer 122 on the upper surface of the patterned etch mask 108 is not shown as it is not required for purposes of the presently disclosed inventions.

Still referencing FIG. 7, an etching process was then performed to remove the portions of the gate insulation layer 118 that are positioned above the upper surface of the recessed continuous conductive gate electrode material layer 122. Next, a continuous layer of upper spacer material 126 was formed above the gate electrode material layer 122 for all of the transistors 104. The layer of upper spacer material 126 may be formed to any desired thickness, e.g., 4-15 nm, and it may be formed from any desired insulating material, e.g., a low-k insulating material (k value of 7 or less), silicon dioxide, etc. The layer of upper spacer material 126 and the layer of bottom spacer material 116 may be comprised of the same material, but that may not be the case in all applications. In one embodiment, the layer of upper spacer material 126 may be formed using the same techniques as described above with respect to the formation of the layer of bottom spacer material 116.

Figure 8:
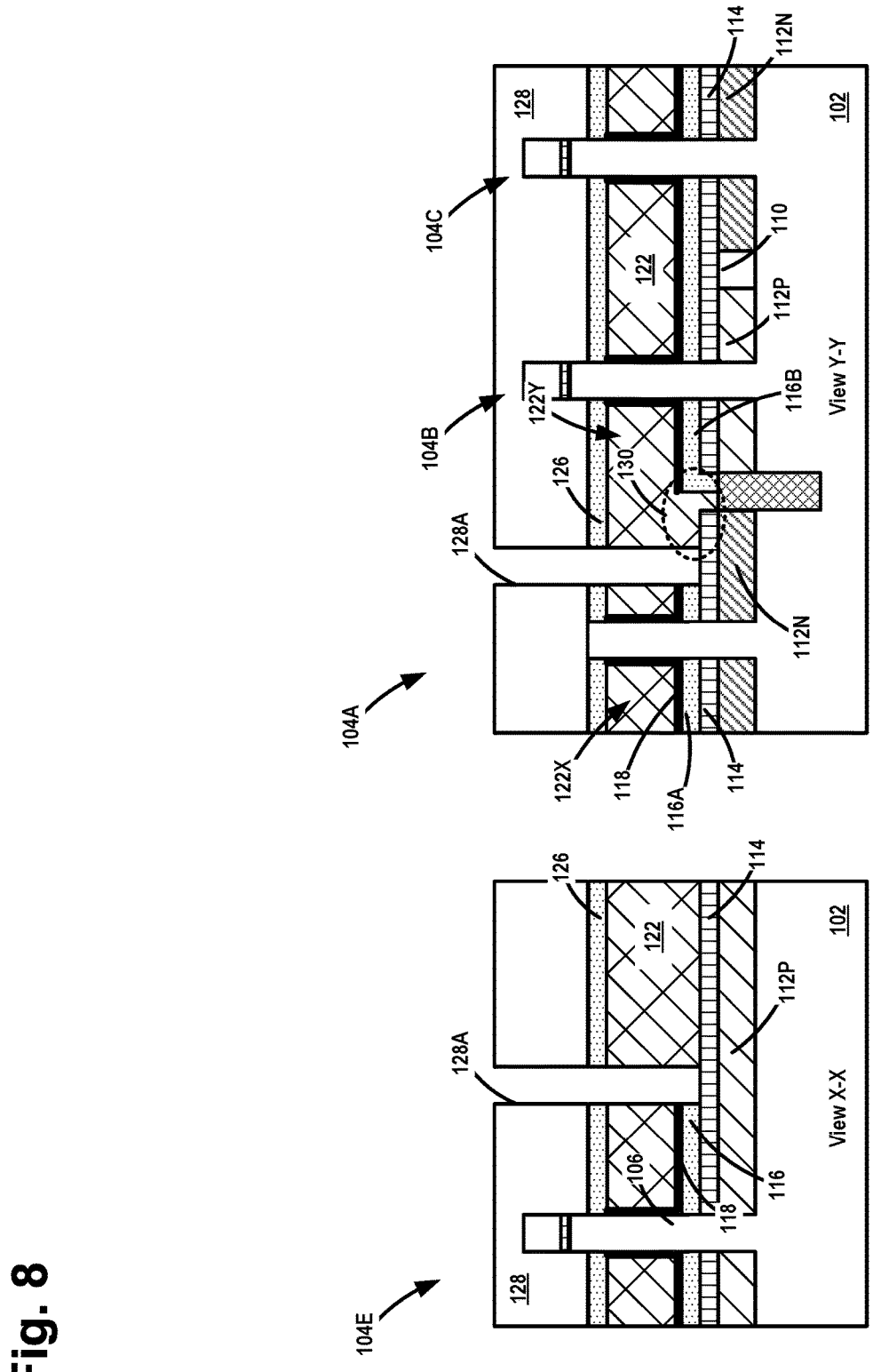

FIG. 8 depicts the product 100 after several process operations were performed. First, a patterned etch mask 128, e.g., a patterned layer of photoresist, with an opening 128A formed therein, was formed above the upper spacers 126. Then, one or more etching processes were performed through the patterned etch mask 128 to remove exposed portions of the layer of upper spacer material 126, the gate electrode material 122 and the gate insulation layer 118. The process operation exposed a portion of the bottom source/drain region 112N, i.e., a portion of the metal silicide material 114 of the transistor 104A. Also note that this process operation separates the gate electrode material 122 and effectively defines separate gate electrode structures for the transistors 104A and 104B. More specifically, performing this process operation defines a first conductive gate electrode structure 122X that is positioned around the VOCS structure 106 of the transistor 104A and a second conductive gate electrode structure 122Y that is positioned around the VOCS structure 106 of the transistor 104B. In this example, the transistors 104B, 104C effectively share the same gate electrode structure 122Y. This process operation defines or forms a gate structure-to-source/drain conductive contact structure 130 that is part of the conductive gate electrode structure 122Y of the transistor 104B. The gate structure-to-source/drain conductive contact structure 130 that is positioned in the gate-to source/drain contact opening 121 is the means by which the gate electrode 122Y of the transistor 104B is conductively coupled to the bottom source/drain region 112N of the transistor 104A.

Figure 9:
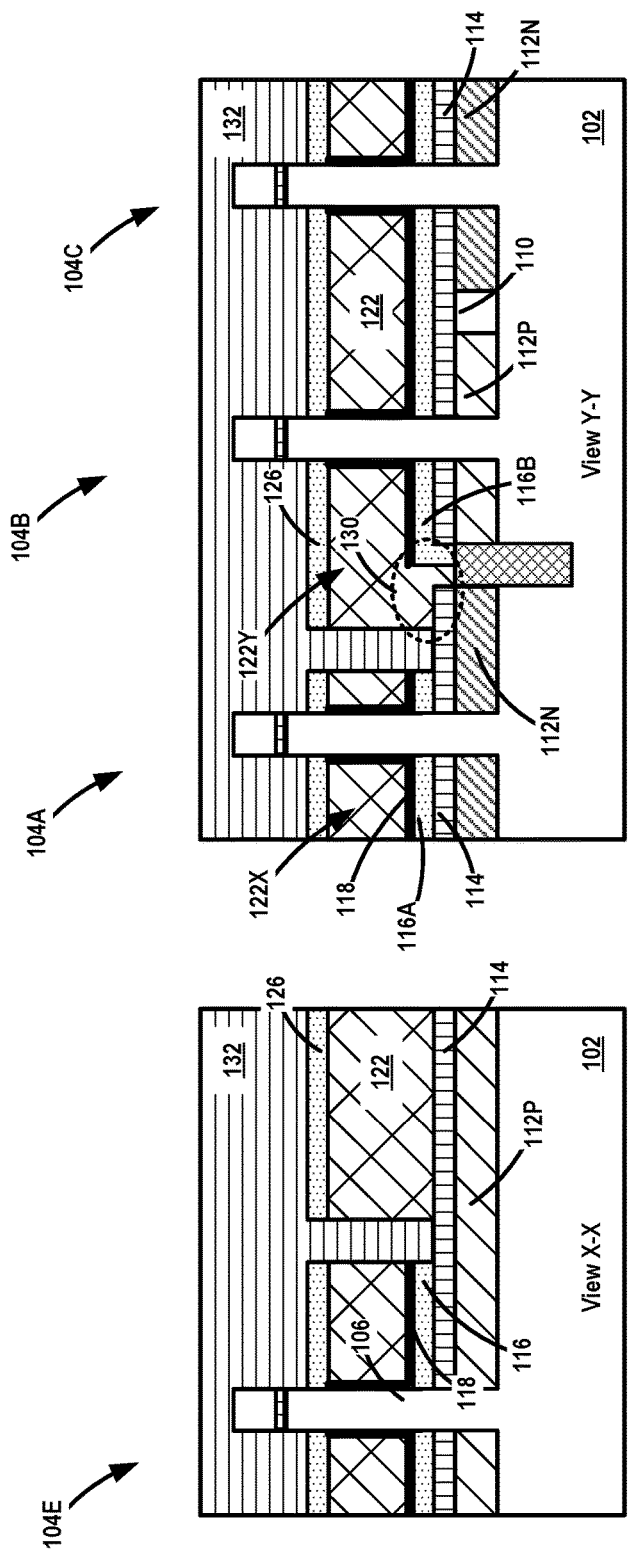

FIG. 9 depicts the product 100 after several process operations were performed. First, the patterned etch mask 128 was removed. Then, a blanket-deposition process was performed to form a layer of insulating material 132 across the product 100. The layer of insulating material 132 may be comprised of any desired material, e.g., silicon dioxide, etc. so as to fill the spaces or openings in the gate electrode material 122 between the first and second gate electrode structures 122X and 122Y described above. Thereafter, in one embodiment, a CMP process was performed on the layer of insulating material 132 to planarize its upper surface.

Figure 10:
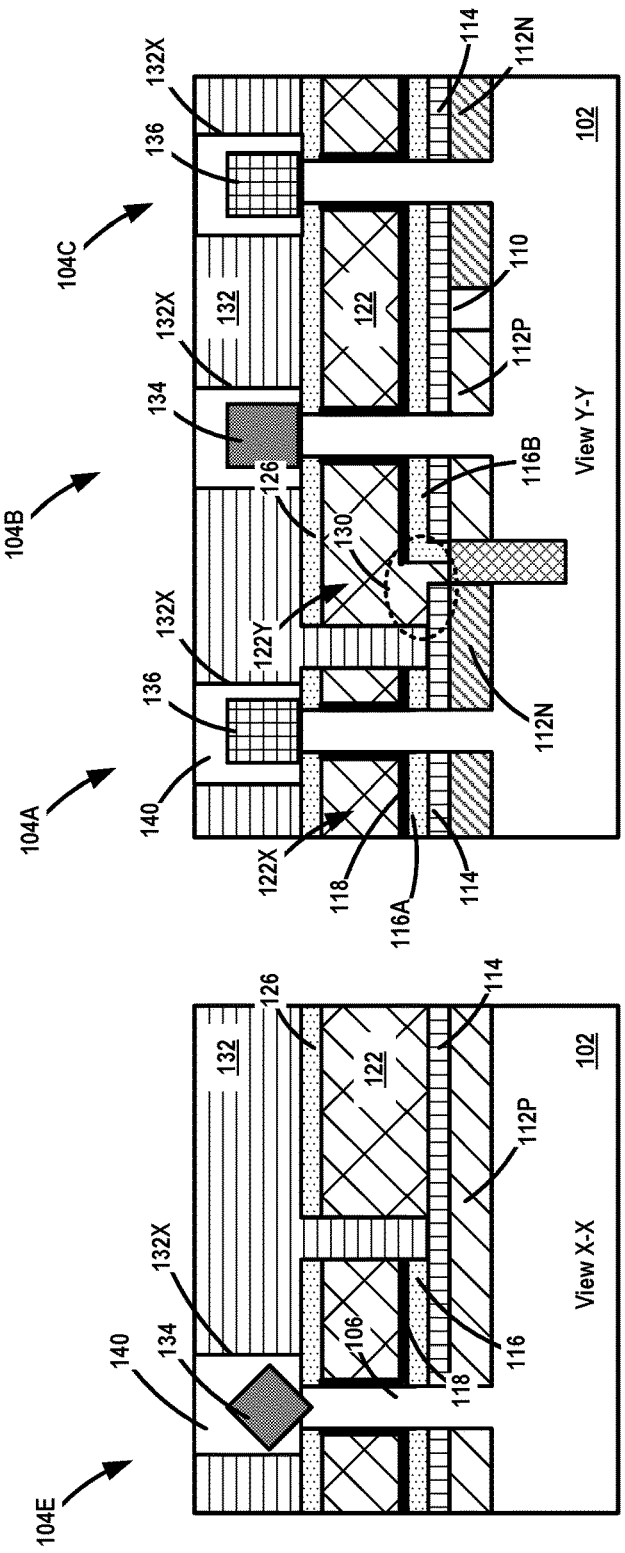

FIG. 10 depicts the product 100 after several process operations were performed. First, in one illustrative process flow, a patterned etch mask (not shown) was formed above the layer of insulating material 132. At that point, an etching process was performed to form a plurality of openings 132X in the layer of insulating material 132. The openings 132X expose the patterned etch mask 108 positioned above the VOCS structures 106. At that point, the patterned etch mask 108 was removed by performing an etching process so as to expose the upper surfaces of the VOCS structures 106. Alternatively, a CMP process that stops on the upper surface of the patterned etch mask 108 may be performed so as to expose the patterned etch mask 108 for removal. Next, one or more etching processes may be performed to remove the patterned etch mask 108 and thereby expose the upper surfaces of the VOCS structures 106.

Still referencing FIG. 10, with the upper surfaces of the VOCS structures 106 exposed, doped epi semiconductor materials were formed on the VOCS structures 106. More specifically, P-doped epi semiconductor material was formed on the VOCS structures 106 of the transistors 104B and 104 E so as to form P-doped upper or top source/drain regions 134 on the transistors 104B and 104E. Similarly, N-doped epi semiconductor material was formed on the VOCS structures 106 of the transistors 104A and 104C so as to form N-doped upper or top source/drain regions 136 on the transistors 104A and 104C. Appropriate masking layers (not shown) were formed so as to expose and mask the appropriate transistors during these separate epi deposition processes. After formation of the upper source/drain regions 134, 136, a layer of insulating material 140 was deposited in the openings 132X and a CMP process operation was performed. In the alternative case (described above), another layer of insulating material may be formed above the remaining portions of the layer of insulating material 132 after the formation of the upper source/drain regions 134, 136. At the point of fabrication depicted in FIG. 10, traditional manufacturing techniques may be performed to form various contact structures (not shown) to the gate structures, the bottom source/drain regions and the upper source/drain regions of the transistors 104.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a gate structure-to-source/drain conductive contact structure between a first vertical transistor that comprises a first bottom source/drain (S/D) region and a second vertical transistor that comprises a second bottom source/drain (S/D) region, the method comprising:
   performing at least one first etching process to remove a portion of at least a layer of a bottom spacer material positioned above said first bottom source/drain (S/D) region so as to thereby form a gate-to-source/drain contact opening that exposes a portion of said first bottom S/D region;
   forming a continuous conductive gate electrode material layer above said first and second bottom S/D regions and within said gate-to-source/drain contact opening; and
   performing at least one second etching process to remove a portion of said continuous gate electrode material layer so as to form first and second separate gate structures for said first and second vertical transistors, respectively, wherein a portion of said second gate structure is positioned within said gate-to-source/drain contact opening, thereby conductively coupling said second gate structure to said first bottom S/D region.

2. The method of claim 1, wherein said first bottom S/D region comprises a first layer of doped epi semiconductor material and a metal silicide layer positioned on said first layer of doped epi semiconductor material and wherein said gate-to-source/drain contact opening exposes a portion of said metal silicide layer of said first bottom S/D region.

3. The method of claim 2, wherein said portion of said second gate structure within said gate-to-source/drain contact opening is positioned on and in contact with said metal silicide layer of said first bottom S/D region.

4. The method of claim 1, wherein said layer of said bottom spacer material comprises one of silicon dioxide or a low-k insulating material and said continuous conductive gate electrode material layer comprises a metal.

5. The method of claim 1, wherein, prior to forming said continuous conductive gate electrode material layer, the method further comprises forming a continuous gate insulation layer above said layer of said bottom spacer material.

6. The method of claim 5, wherein performing said at least one second etching process removes at least a portion of said continuous gate insulation layer.

7. The method of claim 1, further comprising forming an insulating material between said first and second separate gate structures.

8. The method of claim 1, wherein, prior to performing said at least one second etching process, the method further comprises forming a continuous layer of a top spacer material above said continuous conductive gate electrode material layer and wherein performing said at least one second etching process comprises performing said at least one second etching process to remove at least a portion of said continuous layer of said top spacer material.

9. A method of forming a gate structure-to-source/drain conductive contact structure between a first vertical transistor and a second vertical transistor, the method comprising:
   forming a continuous layer of a bottom spacer material above first and second bottom source/drain (S/D) regions of said first and second vertical transistors, respectively, and above an isolation region positioned in a semiconductor substrate and laterally between said first and second bottom S/D regions;
   forming a continuous gate insulation layer above said continuous layer of said bottom spacer material;
   performing at least one first etching process to remove a portion of said continuous gate insulation layer and a portion of said continuous layer of said bottom spacer material so as to thereby form a gate-to-source/drain contact opening that exposes a portion of said first bottom S/D region;
   forming a continuous conductive gate electrode material layer above said first and second bottom S/D regions and within said gate-to-source/drain contact opening; and
   performing at least one second etching process to remove at least portions of said continuous gate electrode material layer and said gate insulation layer so as to form first and second separate gate structures for said first and second vertical transistors, respectively, wherein a portion of said second gate structure is positioned within said gate-to-source/drain contact opening, thereby conductively coupling said second gate structure to said first bottom S/D region.

10. The method of claim 9, wherein said first bottom S/D region comprises a first layer of doped epi semiconductor material and a metal silicide layer positioned on said first layer of doped epi semiconductor material, and wherein said gate-to-source/drain contact opening exposes a portion of said metal silicide layer of said first bottom S/D region and said portion of said second gate structure within said gate-to-source/drain contact opening is positioned on and in contact with said metal silicide layer of said first bottom S/D region.

11. The method of claim 9, wherein, prior to performing said at least one second etching process, the method further comprises forming a continuous layer of a top spacer material above said continuous conductive gate electrode material layer and wherein performing said at least one second etching process comprises performing said at least one second etching process to remove at least a portion of said continuous layer of said top spacer material.

12. An integrated circuit product comprising:
a first vertical transistor comprising:
  a first vertically oriented channel semiconductor (VOCS) structure;
  a first bottom source/drain (S/D) region positioned around said first VOCS structure;
  a first bottom spacer positioned above said first bottom S/D region and around said first VOCS structure, said first bottom spacer having a gate-to-source/drain contact opening formed therein; and
  a first gate electrode structure positioned above said first bottom spacer and around said first VOCS structure; and
a second vertical transistor comprising:
  a second vertically oriented channel semiconductor (VOCS) structure;
  a second bottom source/drain (S/D) region positioned around said second VOCS structure;
  a second bottom spacer positioned above said second bottom S/D region and around said second VOCS structure; and
  a second gate electrode structure positioned above said second bottom spacer and around said second VOCS structure, wherein a portion of said second gate structure is positioned within said gate-to-source/drain contact opening, thereby conductively coupling said second gate structure to said first bottom S/D region.

13. The integrated circuit product of claim 12, further comprising an isolation region positioned in a semiconductor substrate and laterally between said first and second bottom S/D regions, wherein a portion of said second gate structure is positioned vertically above said isolation region.

14. The integrated circuit product of claim 12, wherein said first bottom S/D region comprises a first layer of doped epi semiconductor material and a metal silicide layer positioned on said first layer of doped epi semiconductor material and wherein said gate-to-source/drain contact opening exposes a portion of said metal silicide layer of said first bottom S/D region and wherein said portion of said second gate structure within said gate-to-source/drain contact opening is positioned on and in contact with said metal silicide layer of said first bottom S/D region.

15. The integrated circuit product of claim 12, wherein said first and second bottom spacers comprise one of silicon dioxide or a low-k insulating material and said first and second gate electrode structures comprise a metal.

16. The integrated circuit product of claim 12, wherein said first vertical transistor further comprises:
  a first gate insulation layer positioned between said first bottom spacer and said first gate structure; and
  a second gate insulation layer positioned between said second bottom spacer and said second gate structure.

17. The integrated circuit product of claim 12, further comprising an insulating material between said first and second separate gate structures.

18. The integrated circuit product of claim 17, wherein said first and second bottom spacers comprise a same first insulating material and said first and second gate electrode structures comprise a same first metal-containing material.

* * * * *